United States Patent
Huang et al.

(10) Patent No.: US 12,027,504 B2
(45) Date of Patent: Jul. 2, 2024

(54) METHOD FOR IMPROVING THE COLOUR DIFFERENCE OF LED DISPLAY SCREEN

(71) Applicants: Zhuhai China Eagle Electronic Circuits Co., Ltd., Zhuhai (CN); Huizhou China Eagle Electronic Technology Co., Ltd, Huizhou (CN)

(72) Inventors: Guoke Huang, Huizhou (CN); Hua Xiang, Huizhou (CN); Jun Yang, Huizhou (CN); Xiaofeng Yu, Huizhou (CN)

(73) Assignee: Huizhou China Eagle Electronic Technology Co., Ltd.

( * ) Notice: Subject to any disclaimer, the term of this patent is extended or adjusted under 35 U.S.C. 154(b) by 472 days.

(21) Appl. No.: 17/602,798

(22) PCT Filed: Dec. 6, 2019

(86) PCT No.: PCT/CN2019/123789
§ 371 (c)(1),
(2) Date: Oct. 11, 2021

(87) PCT Pub. No.: WO2020/211401
PCT Pub. Date: Oct. 22, 2020

(65) Prior Publication Data
US 2022/0157792 A1    May 19, 2022

(30) Foreign Application Priority Data

Apr. 16, 2019   (CN) .......................... 201910305373.2

(51) Int. Cl.
*H01L 33/08*   (2010.01)
*H01L 25/075*   (2006.01)
*H01L 33/62*   (2010.01)

(52) U.S. Cl.
CPC .......... *H01L 25/0753* (2013.01); *H01L 33/62* (2013.01); *H01L 2933/0066* (2013.01)

(58) Field of Classification Search
CPC ......... H01L 33/00; H01L 33/06; H01L 33/08; H01L 33/18; H01L 33/24; H01L 33/62;
(Continued)

(56) References Cited

U.S. PATENT DOCUMENTS

2012/0132937 A1*   5/2012   Chan .................... H01L 25/0753
257/E33.059
2014/0191187 A1*   7/2014   Zhang .................... H01L 33/24
438/47

FOREIGN PATENT DOCUMENTS

CN   207481408 U   6/2018

* cited by examiner

*Primary Examiner* — Chuong A Luu
(74) *Attorney, Agent, or Firm* — Jose Cherson Weissbrot

(57) ABSTRACT

The present application provides a method for improving colour difference of an LED display screen, comprising: drilling and polishing circuit surfaces of a plurality of LED substrates; performing screen printing on the circuit surfaces of the plurality of LED substrates, and performing oil skimming on a mesh screen during the screen printing every other preset printing cycle in such a way that an ink on the mesh screen has a viscosity within a predetermined viscosity range; performing an exposure setting process on the plurality of LED substrates that have been screen printed to obtain a plurality of LED printed circuit boards; and finally assembling the plurality of LED printed circuit boards to form an LED display screen.

10 Claims, 3 Drawing Sheets

(58) Field of Classification Search
CPC ..... H01L 33/648; H01L 27/15; H01L 27/153; H01L 27/156; H01L 25/175; H01L 25/0753; H01L 25/167; H01L 2933/00; H01L 2933/0066; H01L 2933/0091; H05K 3/00; H05K 3/0047
USPC .......................................................... 438/28
See application file for complete search history.

Attach the circuit surfaces of the plurality of LED substrates to a mesh screen and place the circuit surfaces of the plurality of LED substrates below a hollow pattern of the mesh screen; place the ink on the mesh screen — S201

Move a squeegee back and forth on the mesh screen to scrape the link to form a same ink pattern as the hollow pattern on the circuit surfaces of the plurality of LED substrates. — S202

FIG. 4

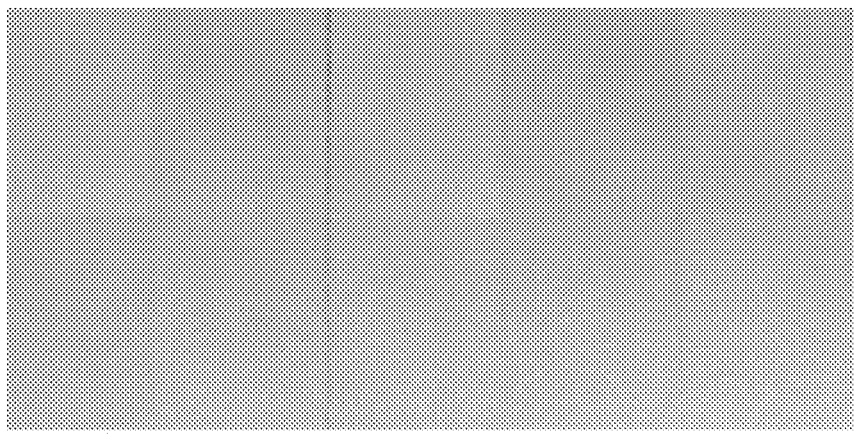

FIG. 5

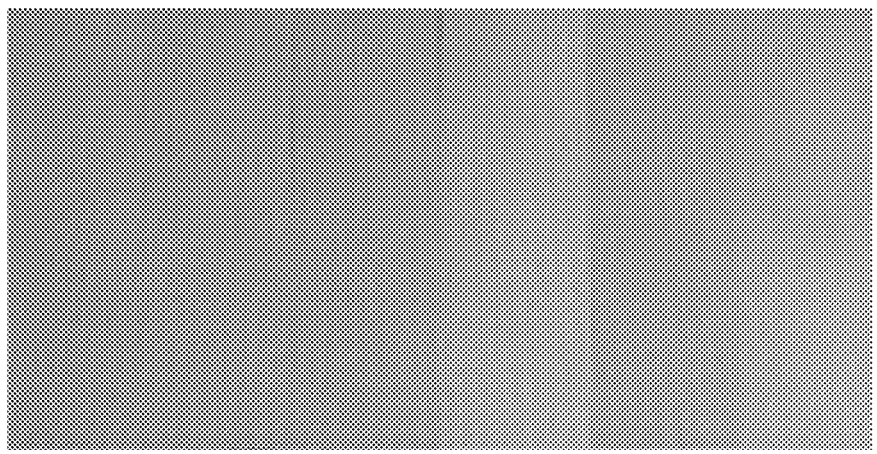

FIG. 6

METHOD FOR IMPROVING THE COLOUR DIFFERENCE OF LED DISPLAY SCREEN

TECHNICAL FIELD

The present application relates to the field of LED display manufacturing process, and more particularly to a method for improving the colour difference of LED display screen.

BACKGROUND

Presently, there are two major types of display screens on the market: LCD display screens and LED display screens. However, due to the different light-emitting principles of LCD display screens and LED display screens, LED display screens have lower energy consumption, longer battery life and higher brightness, compared to LCD display screens. As such, research on LED display screens on the market is widely supported, and the application of LED display screens has become more popular.

In the manufacturing process of LED display screens, the main method is to first produce a plurality of LED printed circuit boards, then assemble the LED printed circuit boards, and finally use the assembled LED printed circuit boards as LED display screens. However, in order to prevent the etchings of the electronic circuit boards and enhance the insulation of the components in the circuit boards, ink is printed on the circuit boards; Meanwhile, photosensitive ink is printed on the LED printed circuit boards to increase the utilisation rate of LED light sources.

Nevertheless, in the current manufacturing process of LED display screens, as the thickness and viscosity of the photosensitive ink printed on the LED printed circuit boards vary, there can easily be colour difference between each individual LED printed circuit board. When multiple LED printed circuit boards are assembled to form an LED display screen, there will be the "mosaic" visual effect, which affects the image display of the LED display screen.

SUMMARY

The embodiments of the present application disclose a method for improving the colour difference of LED display screen, in a bid to improve the image display of LED display screens which is affected by the colour difference between each LED printed circuit boards in the state-of-art LED display screens.

A method for improving a colour difference of LED display screen comprising:

Drill and polish the circuit surfaces of a plurality of LED substrates;

Performing screen printing on the circuit surfaces of the plurality of LED substrates, and perform oil skimming on a the mesh screen during the screen printing every other preset printing cycle in such a way that an ink viscosity on the mesh screen has a viscosity within a predetermined viscosity range;

Performing an exposure setting process on the plurality of LED substrates that have been screen printed to obtain the plurality of LED printed circuit boards;

Assembling the plurality of LED printed circuit boards to form an LED display screen.

In the present embodiment, firstly, drill and polish the circuit surfaces of the plurality of LED substrates, screen print the circuit surfaces of the plurality of LED substrates, and then perform oil skimmer on the mesh screen during the screen printing every other present printing cycle so that the ink viscosity on the mesh screen is at a predetermined level; then perform the exposure setting process on the plurality of LED substrates that have been screen printed to obtain the plurality of LED printed circuit boards. In the end, assemble the plurality of LED printed circuit boards to form an LED display screen. In the implementation of the present embodiment, by adding the skimmer process to the screen-printing process, the ink viscosity on the mesh screen can be maintained in a small range. Within this range, the colour difference between each LED printed circuit board is small. The plurality of LED substrates are used to form an LED display screen. As such, the "mosaic" visual effect can be significantly reduced, thereby improving the image display effect of the LED display screen.

BRIEF DESCRIPTION OF THE DRAWINGS

To more clearly illustrate the technical solution in the embodiments of the present disclosure, drawings used in the description of the embodiments will be briefly described below. Obviously, the drawings in the following description are some embodiments of the present disclosure. Those skilled in the art can also obtain other drawings based on these drawings without any creative efforts.

FIG. 4 is a flow chart of screen printing on the circuit surface of the LED substrate in the present embodiment;

FIG. 5 is an experimental effect diagram of an experimental group in the present embodiment;

FIG. 6 is an experimental effect diagram of an experimental group in the present embodiment;

DETAILED DESCRIPTION OF THE INVENTION

The technical solution in the embodiments of the present disclosure is clearly and completely described below with reference to the accompanying drawings in the embodiments of the present disclosure. Obviously, the described embodiments are a part of the embodiments of the present disclosure, rather than all of the embodiments. All other embodiments obtained by those skilled in the art based on the embodiments of the present disclosure without paying any creative efforts are within the scope of protection of the present disclosure.

Figure 1:
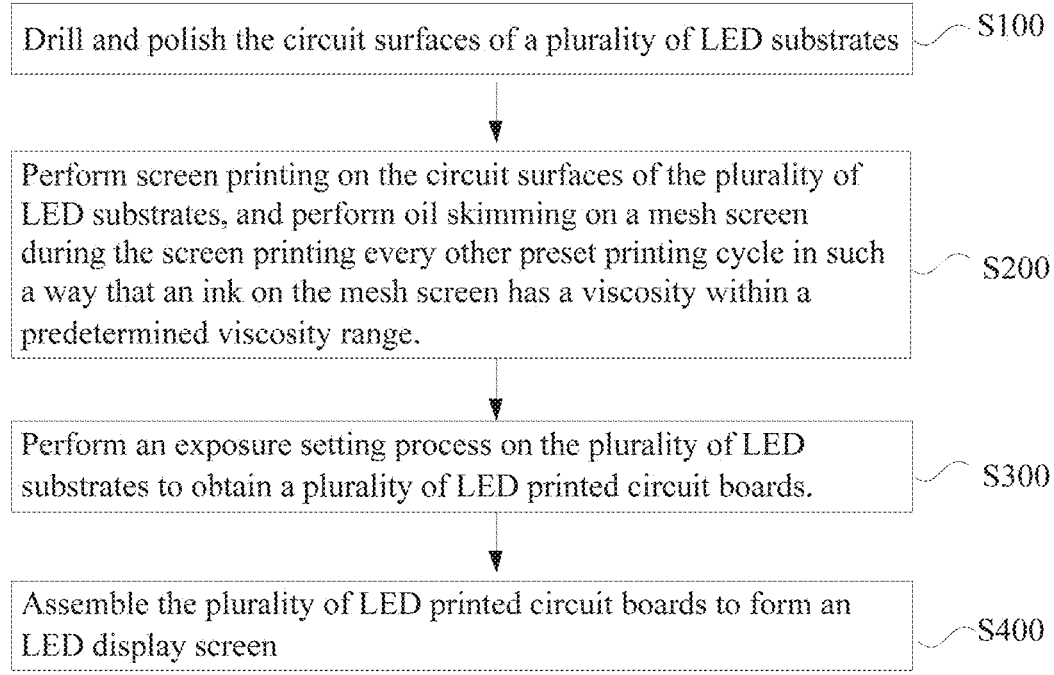
FIG. 1 is a flow chart of the method for improving the colour difference of the LED display screen in the present embodiment.

By reference to FIG. 1, the present embodiment provides a method for improving the colour difference of LED display screen, which comprises:

Step 100: Drill and polish the circuit surface of a plurality of LED substrates.

Step 200: Perform screen printing on the circuit surfaces of the plurality of LED substrates, and perform oil skimming on a mesh screen during the screen printing every other preset printing cycle in such a way that an ink on the mesh screen has a viscosity within a predetermined viscosity range.

Step 300: Perform an exposure setting process on the plurality of LED substrates to obtain a plurality of LED printed circuit boards.

Step 400: Assemble the plurality of LED printed circuit boards to form an LED display screen.

For the above-mentioned step 100, in particular, the circuit surfaces of the plurality of LED substrates are drilled and polished respectively, among which the circuit surface of the LED substrate may be the circuit surface of a single-sided LED substrate or the circuit surface of a double-sided LED substrate. Additionally, the LED substrates may be a glass fibre board and/or an aluminium substrate. That is, the LED substrates may be a fibre glass board, an aluminium substrate, or the combination of a fibre glass board and an aluminium substrate. Further, the glass fibre board may be an alkali-free glass fibre board, a medium-alkali glass fibre board, a high-alkali glass fibre board, etc., and the aluminium substrate may be a tin-sprayed aluminium substrate, an anti-alumina substrate, a silver-plated aluminium substrate, a gold-immersed aluminium substrate, etc.

Figure 2:
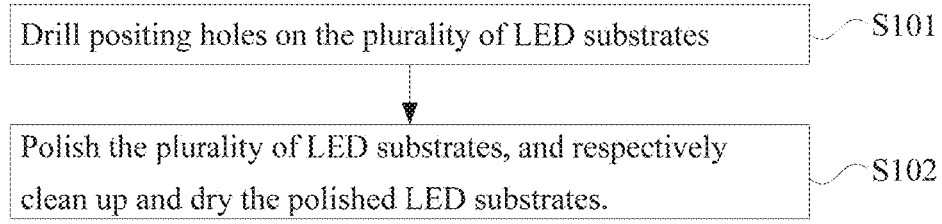
FIG. 2 is a flow chart of the drilling and polishing process in the present embodiment.

By reference to FIG. 2, in the above-mentioned step 100, the process of drilling and polishing includes:

Step 101: Drill positing holes on the plurality of LED substrates.

Step 102: Polish the plurality of LED substrates, and respectively clean up and dry the polished LED substrates.

For the above-mentioned step 101, in particular, positioning holes are drilled on the plurality of LED substrates respectively, so as to form corresponding positioning holes on each LED substrate. The positioning holes may be blind holes, buried holes, through holes, etc. Positioning holes on the LED substrates can be obtained by the following three ways:

Model 1: Fix the LED substrate on a positioning device. For varied models of LED substrates, preset the parameters on a drilling machine to drill the LED substrates.

Model 2: Fix the LED substrate on a positioning device. Align the drilling machine with the positioning hole marks on LED substrates to drill the LED substrates.

Model 3: Fix the LED substrate on a positioning device. Based on the model of the LED substrate and positioning hole marks on the LED substrate, preset the parameters and align the drilling machine with the positioning hole marks to drill the LED substrates.

In the above-mentioned Model 1, Model 2, and Model 3, the LED substrate is fixed on the positioning device, preferably with the circuit side of the LED substrate facing upwards. Additionally, the circuit surface of the LED substrate can also be referred to as the copper surface of the LED substrate.

The implementation of the above step 101 enables to fill positions holes on LED substrates so that the LED substrates can be fixed and positioned during subsequent processing of the LED substrates.

Figure 3:
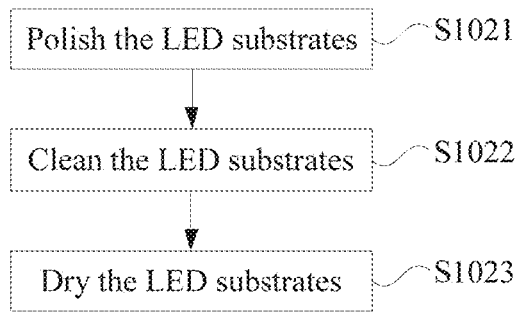
FIG. 3 is a flow chart of the polishing, cleaning, and drying process in the present embodiment.

By reference to FIG. 3. the above-mentioned step 102 includes:

Step 1021: Polish the LED substrates.
Step 1022: Clean the LED substrates.
Step 1023: Dry the LED substrates.

For the above-mentioned step 1021, in particular, the polishing methods may include the employment of automatic polishing equipment and/or manual polishing; The polishing objects may include at least one or more of the circuit surface of the LED substrates, the outer wall of the LED substrates, and the hole wall of the LED substrates. In particular, for instance, the automatic polishing equipment can be a polishing machine, a polishing box, a plate polishing machine, etc., and the manual polishing can be manual polishing with fine sandpaper.

For the above-mentioned step 1022, in particular, tools such as an ultrasonic cleaning machine, organic solvents, and hair dryers can be utilised to clean the LED substrates.

For the above-mentioned step 1023, in particular, dryers are employed to dry the LED substrates.

By implementing the above-mentioned step 102, the LED substrate is polished to make the surface of the LED substrate smooth, improve the quality of printing of the LED substrate in the subsequent printing process, and reduce damage to the screen plate.

It should be appreciated that step 101 and step 102 may not follow the above-mentioned order. That is, for step 101 and step 102, it is also possible for step 102 to come before step 101.

In the above-mentioned step 200, the process of screen printing on the circuit surfaces of the plurality of LED substrates includes the following steps:

Step 201: Attach the circuit surfaces of the plurality of LED substrates to a mesh screen and place the circuit surfaces of the plurality of LED substrates below a hollow pattern of the mesh screen; place the ink on the mesh screen.

Step 202: Move a squeegee back and forth on the mesh screen to scrape the link to form a same ink pattern as the hollow pattern on the circuit surfaces of the plurality of LED substrates.

Regarding step 201, in particular, there are two sections:

Section 1: Place the circuit surface of the LED substrate facing upwards on the feeding platform of the feeder; push the feeding platform to the screen printer through the feeder so that the LED substrate is located directly under the hollow pattern of the mesh screen, and the circuit surface of the LED substrate is attached to the mesh screen.

Section 2: Place ink on the mesh screen.

It should be appreciated that there is no fixed order in the execution of section 1 and section 2.

In step 202, the circuit surface of the LED substrate is attached to the mesh screen and is located directly below the hollow pattern of the mesh screen. Meanwhile, the squeegee scraping back and forth on the mesh screen pressures the ink on the mesh screen into the hallow pattern of the mesh screen and thus forming the same ink pattern as the hollow pattern on the circuit surface of the LED substrate.

In the present embodiment, whenever in step 202 an ink pattern which is the same as the hollow pattern is formed on the circuit surface of an LED substrate, step 201 is re-executed. The same then will be done over and over again until ink patterns that are the same as the hollow pattern are formed on the circuit surface of the plurality of LED substrates.

Before the above-mentioned step 201, the following is also included:

Remove ink from an ink tank. Particularly, ink includes a volatile thinner, which can be, for example, nitrocellulose paint thinner, perchloric vinyl paint thinner, phenolic paint thinner, acrylic paint thinner, alkyd paint thinner, epoxy paint thinner, phenolic paint thinner, silicone paint thinner, etc.

Upon opening the ink tank, the volatile thinner will start to evaporate, and thus raising the viscosity in ink. Further, in order to understand the relationship between the viscosity in ink and the standing time after the ink tank is open, an experiment is conducted. As shown in Table 1, the obtained data denotes that within the time interval [0 min, 120 min] after the ink tank is opened, the viscosity of the ink is [90, 120].

TABLE 1

Test on ink viscosity change (clean room temperature[20° C., 24° C.], humidity[50RH, 60RH])

| Sampling time (minutes) | 0 | 30 | 60 | 90 | 120 |
|---|---|---|---|---|---|
| Viscosity of the ink in the tank (mPa per second) | 90 | 100 | 110 | 120 | 120 |

The circuit boards of the same batch of LED substrates need to be screen printed within two hours using the same batch of ink, which can meet the production needs. Preferably, within the time interval [900 min, 120 min] when the ink tank is left to settle after the ink tank is opened, screen print the circuit boards of the same batch of LED substrates with the ink in the same batch of the ink tank, to maintain the viscosity of the ink and reduce the colour difference between the circuit surface of each LED substrate.

In the present embodiment, the ink tank has a capacity of 5 kg/tank. It should be appreciated that the larger the size of the ink tank is, the more ink can be loaded, and the ink in the ink tank can meet the requirements of screen printing on the circuit surface of more LED substrates. Suppose the ink in the same ink tank can be applied to screen print the circuit surface of more LED substrates, the colour difference between the circuit boards of each LED substrate will be smaller.

In the above-mentioned step 200, perform the oil skimmer process on the mesh screen during the screen printing at every other preset printing cycle so that the viscosity of the ink on the mesh screen is within the preset viscosity range. In particular, the skimmer process goes like this: scrape the ink on the edge of the mesh screen towards the centre of the mesh screen; meanwhile, over the course of screen printing, the preset number of LEDs substrates is printed as a preset printing cycle, and the preset number has a value within a range of [20, 40].

Additionally, in the present embodiment, the predetermined viscosity range is [80 dPa·S, 140 dPa·S]. It should be appreciated that the preset viscosity range of the ink is [80 dPa·S, 140 dPa·S], which can meet production requirements. Meanwhile, within the preset viscosity range of the ink, the smaller the viscosity difference between the inks on the circuit surface of each LED substrate, the smaller the colour difference between the circuit surfaces of each LED substrate.

In order to better illustrate the present embodiment, the reason for the oil skimmer of the mesh screen will be described in detail here. As the squeegee scrapes the ink back and forth on the mesh screen, some ink will be scraped onto the edge of the mesh screen. Moreover, as the ink has a certain degree of fluidity and yet the fluidity is low, this will lead to a situation where although there is a tendency for the ink at the edge of the mesh screen to flow towards the centre area, the speed of ink flowing towards the centre is still relatively low, which further causes a part of the ink to be exposed to the air for a long time. The viscosity of this part of the ink is different from that of the ink around the centre area of the mesh screen, and the ink flowing from the edge towards the centre will cause a big change in the original viscosity of the ink at the centre of the mesh screen, and thus affecting the colour difference between the circuit surfaces of the plurality of LED substrates.

Therefore, by scraping the ink at the edge of the mesh screen, the ink at the edge can be better integrated with the ink at the centre so that the difference viscosity between the ink at the edge of the mesh screen and the ink at the centre area can be maintained in a small range and the amount of ink exposed to the air for a long time is reduced, thereby reducing the colour difference between the circuit surfaces of the plurality of LED substrates.

In order to prove that the viscosity of the ink at the edge of the mesh screen is quite different from that of the ink near the centre of the mesh screen, it is necessary to know the relationship between the viscosity of the ink at the edge of the mesh screen and time, as well as the relationship between the viscosity of the ink at the centre of the mesh screen and time. As such, an experiment is conducted. The data obtained from the experiment are shown in Table 2 below. From the obtained data, it can be seen that within two hours there is little change in the viscosity of the ink at the edge of the mesh screen, while there is a drastic difference in the viscosity of the ink closer to the centre area of the mesh screen. Therefore, within two hours, the viscosity difference of the ink near the centre of the mesh screen is small, and the viscosity difference in the ink at the edge of the mesh screen during the time interval [60 min, 120 min] is larger.

TABLE 2

Test on Ink viscosity change (clean room temperature[20° C., 24° C.], humidity[50RH, 60RH])

| Sampling time (minutes) | 0 | 30 | 60 | 90 | 120 |
|---|---|---|---|---|---|
| Viscosity of the ink at the centre of the mesh screen (mPa per second) | 125 | 125 | 125 | 130 | 120 |
| Viscosity of the ink at the periphery of the mesh screen (mPa per second) | 125 | 135 | 155 | 185 | 135 |

In order to illustrate the technical effect brought about by the oil skimmer process in the present embodiment, the following three sets of experiments are carried out:

Experimental group 1: No oil skimmer is conducted over the course of screen printing.

Experimental group 2: For every preset printing cycle, oil skimmer 1 is conducted on the mesh screen during the screen printing, and every 40 LED substrates are printed as a cycle.

Experimental group 3: For every preset printing cycle, an oil skimmer is conducted on the mesh screen during the screen printing, and every 40 LED substrates are printed as a cycle.

Figure 7:
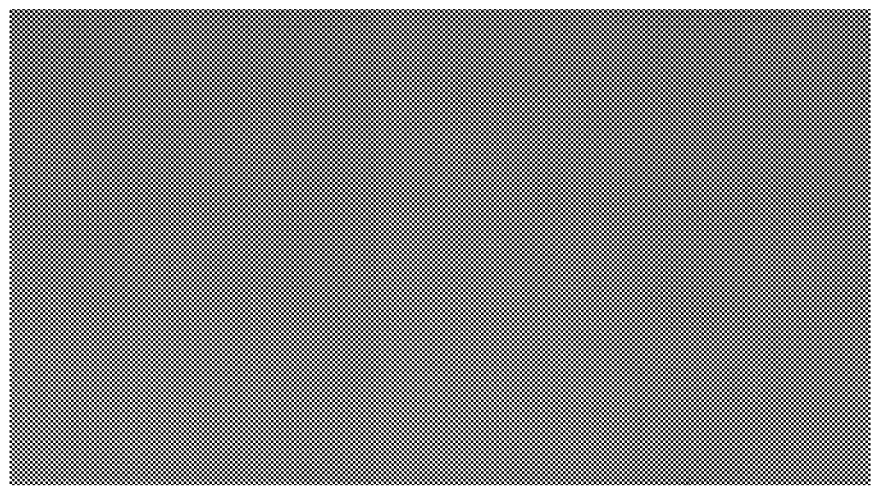
FIG. 7 is an experimental effect diagram of an experimental group in the present embodiment.

The results of the LED display screen corresponding to experimental group 1, experimental group 2 and experimental group 3 are shown respectively in FIG. 5, FIG. 6 and FIG. 7. According to FIG. 5, FIG. 6 and FIG. 7, in order from good to bad reading the colour difference between each LED printed circuit board in the LED display screen, the three experimental groups are ranked as follows: experimental group 3, experimental group 2, and experimental group 1.

It can be seen through the experiments that when conducting the oil skimmer process on the mesh screen every other preset printing cycle, the shorter the preset printing cycle, the smaller the colour difference between each LED printed circuit board in the LED display screen.

Through the implementation of the above step 200, the colour difference between each LED printed circuit board in the LED display screen can be effectively reduced.

For the above step 300, the abstained the plurality of LED printed circuit boards are finished products.

Figure 8:
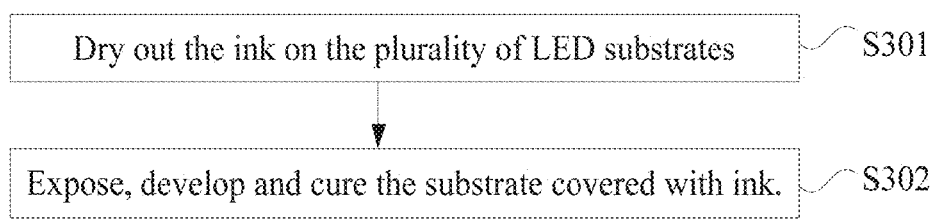
FIG. 8 is a flow chart of the exposure setting process in the present embodiment.

As shown in FIG. 8, in the above step 300, the exposure setting process further includes the following:

Step 301: Dry out the ink on the plurality of LED substrates.

Step 302: Expose, develop and cure the substrate covered with ink.

For step 301, in particular, the LED substrate is placed on a dryer for drying.

For step 302, an exposure machine is used to expose the corresponding position of the workpiece, and the exposed workpiece is developed, and the LED substrate is cured. Among them, the exposure machine may be an LED hybrid wave exposure machine. Meanwhile, the exposure ruler has 7 to 11 divisions. Additionally, the LED substrate can be cured by ultraviolet curing or thermal curing.

Through the implementation of step 300, the plurality of screen-printed LED substrates are assembled to form the plurality of LED printed circuit boards.

For the above step 400, in particular, the assembly can be carried out through a printed circuit board connector to obtain an LED display screen that meets a predetermined specification. Further, the predetermined specifications may be LED display screen size specifications, pixel requirements, grey level requirements, and so on.

Through the implementation of step 400, an LED display screen that meets a predetermined specification can be obtained.

Through the implementation of the present embodiment, the colour difference between the LED printed circuit boards in the LED display screen can be effectively reduced, and the "mosaic" visual effect can be significantly reduced, and thus the problem of the image display effect of the LED display screen can be effectively improved.

It should be understood that the size of the sequence numbers of the above processes does not imply a sequence of executions, and the order of execution of the processes should be determined by its function and internal logic, and should not be construed as limiting the implementation process of the embodiments of the present invention.

The above embodiment is only used to illustrate the present invention and not to limit the technical solution described in the present invention. The understanding of this specification should base on those skilled in the art, although the present invention has been described in detail with reference to the above embodiment. However, those skilled in the art should understand that those skilled in the art can still modify or equivalently replace the present invention, and all technical solutions and improvements that do not depart from the spirit and scope of the present solution should be covered within the scope of the claims of the present invention.

What is claimed is:

1. A method for improving a colour difference of LED display screen, comprising:

drilling and polishing circuit surfaces of a plurality of LED substrates;

performing screen printing on the circuit surfaces of the plurality of LED substrates, and performing oil skimming on a mesh screen during the screen printing every other preset printing cycle in such a way that an ink on the mesh screen has a viscosity within a predetermined viscosity range;

performing an exposure setting process on the plurality of LED substrates that have been screen printed to obtain a plurality of LED printed circuit boards; and assembling the plurality of LED printed circuit boards to form an LED display screen.

2. The method of claim 1, wherein the drilling and polishing circuit surfaces of a plurality of LED substrates comprises:

drilling positing holes on the plurality of LED substrates; and polishing the plurality of LED substrates, and cleaning up and drying the polished LED substrates sequentially.

3. The method of claim 1, wherein the performing screen printing on the circuit surfaces of the plurality of LED substrates comprises:

attaching the circuit surfaces of the plurality of LED substrates to the mesh screen and placing the circuit surfaces of the plurality of LED substrates below a hollow pattern of the mesh screen and placing the ink on the mesh screen; and moving a squeegee back and forth on the mesh screen to scrape the ink to form a same ink pattern as the hollow pattern on the circuit surfaces of the plurality of LED substrates.

4. The method of claim 3, wherein before the placing the circuit surfaces of the plurality of LED substrates below a hollow pattern of the mesh screen, and placing the ink on the mesh screen, the method further comprises:

removing ink from an ink tank; wherein the ink tank has a capacity of 5 kg/tank.

5. The method of claim 1, wherein in the performing screen printing, taking a time for printing a preset number of LED substrates as a preset printing cycle, and the preset number has a value within a range of [20, 40].

6. The method of claim 1, wherein the performing oil skimming comprises: scraping the ink on an edge of the mesh screen towards a centre position of the mesh screen.

7. The method of claim 1, wherein the predetermined viscosity range is [80 dPa·S, 140 dPa·s].

8. The method of claim 1, wherein the performing an exposure setting process comprises:

drying out the ink on the plurality of LED substrates; and exposing, developing and curing the substrates covered with ink.

9. The method of claim 1, wherein the LED substrates comprise glass fibre boards and/or an aluminium substrates.

10. The method of claim 1, wherein the ink comprises a volatile thinner.

* * * * *